(12) United States Patent
Zhang et al.

(10) Patent No.: US 9,261,552 B2
(45) Date of Patent: Feb. 16, 2016

(54) FAULT DETECTOR FOR OPERATING PROCESS OF ELECTRIC ARC FURNACE AND METHOD THEREOF

(75) Inventors: Yingwei Zhang, Shenyang (CN); Wenyou Du, Shenyang (CN); Zhiming Li, Shenyang (CN); Yunpeng Fan, Shenyang (CN)

(73) Assignee: Northeastern University, Shenyang, Liaoning Province (CN)

( * ) Notice: Subject to any disclaimer, the term of this patent is extended or adjusted under 35 U.S.C. 154(b) by 569 days.

(21) Appl. No.: 13/807,874

(22) PCT Filed: Jan. 31, 2011

(86) PCT No.: PCT/CN2011/070852
§ 371 (c)(1),
(2), (4) Date: Dec. 31, 2012

(87) PCT Pub. No.: WO2012/103682
PCT Pub. Date: Aug. 9, 2012

(65) Prior Publication Data
US 2013/0110422 A1    May 2, 2013

(51) Int. Cl.
*G01R 31/08* (2006.01)
*G06F 15/00* (2006.01)
*F27B 3/08* (2006.01)
*F27B 3/28* (2006.01)
*F27D 19/00* (2006.01)
*F27D 21/04* (2006.01)

(52) U.S. Cl.
CPC ............. *G01R 31/08* (2013.01); *F27B 3/085* (2013.01); *F27B 3/28* (2013.01); *F27D 19/00* (2013.01); *F27D 21/04* (2013.01); *G06F 15/00* (2013.01)

(58) Field of Classification Search
CPC ......... H02H 1/0007; H02H 3/10; H02H 3/28; H02H 7/045; F27B 3/085; F27B 3/28; F27B 19/00; F27B 21/04; G01R 31/08; G06F 15/00
USPC ............... 702/58, 60, 132, 62, 116, 117, 118; 373/36, 60, 136, 102
See application file for complete search history.

(56) References Cited

U.S. PATENT DOCUMENTS 6,810,069 B2 * 10/2004 Kojovic et al. .................. 373/60

FOREIGN PATENT DOCUMENTS

| CN | 2674499 Y | 1/2005 |
| CN | 2932448 Y | 8/2007 |

(Continued)

*Primary Examiner* — John H Le
(74) *Attorney, Agent, or Firm* — Muncy, Geissler, Olds & Lowe, P.C.

(57) ABSTRACT

A fault detector for operating process of electric arc furnace and method thereof are disclosed, which belong to the technical field of fault detection. The fault detector includes the temperature signal acquisition equipment, the current signal acquisition equipment and a host computer. The multimode fault monitoring and diagnosis method comprises the following steps: acquiring and standardizing the data; establishing the preliminary monitoring model for the operating process to obtain common subsets of M operating modes and typical subsets of every operating mode; calculating the $T^2$ statistics and the SPE statistics, and monitoring and diagnosing fault in the operating process. The present invention has the advantages that the colorimetric temperature measurement can improve the calculation accuracy, different equipment becomes compatible, and the fault detector is suitable for operating in industrial production process with a variety of steady modes and can diagnose faults in a certain operating mode.

4 Claims, 9 Drawing Sheets

(56) References Cited

FOREIGN PATENT DOCUMENTS

| CN | 101071306 A | 11/2007 |
| CN | 101261762 A | 9/2008 |
| JP | 2004156865 A | 6/2004 |
| JP | 2007026799 A | 1/2005 |

\* cited by examiner

FAULT DETECTOR FOR OPERATING PROCESS OF ELECTRIC ARC FURNACE AND METHOD THEREOF

BACKGROUND OF THE INVENTION

1. Field of the Invention

The present invention relates to a fault detector for operating process of an electric arc furnace and a method thereof, which belongs to the technical field of fault detection.

2. The Prior Arts

Electric arc furnace operates by three-phrase AC power, and is used to melt ore and metal with the electric arc between the electrodes and the molten materials. In the operating process, the electric arc furnace produces lots of waste gas which is exhausted by raising and lowering the electrodes. If the electrodes are not adjusted in time, a mass of gas can accumulate in the electric arc furnace, which can result in voids in the products. If the backlog gas is excessive, the molten material in the furnace may spray. Moreover, the electrodes position appears excursion during adjustment, and distribution of the materials in the electric arc furnace is not homogeneous, so the temperature around electrodes is high, however the temperature around other electrodes is low. The imbalance distribution of heat would influence the quality of products. More serious, if the imbalance distribution of heat exists for a long time, in the higher temperature portion of the electric arc furnace, the temperature rises sharply. And the furnace could be even worn out without effective detection and prevention.

Fault detection and diagnosis have been the key means to ensure the safety of equipment and personnel and the quality of products. In the past several decades, Principal Component Analysis (PCA) and Partial Least Square (PLS) have been used widely in industrial production and got lots of satisfying results. Multivariate Statistics Process Control (MSPC) has also been studied deeply. However, there is often more than one operating mode in the electric arc furnace, so fault detection of the multiple modes of production and multimode productive process becomes more complicated. There is often a lot of problems in the multivariate statistical process control (MSPC) applied to the multimode production process. MSPM may sometimes make some mistakes, even if the production process is working in another steady-state operation mode. The recursive PCA and self-adaptive PLS arise over these years. Although these methods can also be used for online fault detection, it still lacks the ability to deal with the multimode operating process, and the detection results are unsatisfactory.

Moreover, because when the arc forms the energy is concentrated and the temperature of the arc zone near the electrodes could be above 3000° C., it is hard to measure. Temperature can be got by observing the temperature of the furnace wall in the traditional production process. The temperature of the furnace wall and that of the molten materials inside the electric arc furnace are usually different because there are specific heat capacity and thermal resistivity. But the temperature in the electric arc furnace is hard to measure. The traditional thermocouple measures temperature by contact, but the thermocouple will melt at high temperature. Therefore, the costs of temperature measurement increase greatly with the raising of the temperature. In this case, some engineers and technicians try to invent advanced thermocouples which can be used at higher temperature by changing the materials. Although the range of temperature which can be measured is widen, due to the restriction of the contact temperature measurement technology, the equipment is worn out seriously. Therefore, the durability of the equipment is affected, and more impurities are generated because the materials are molten in the electric arc furnace, which affects the quality of the products.

SUMMARY OF THE INVENTION

In consideration of the shortage of the prior art, the present invention provides a detector of the production process with an electric arc furnace and a method thereof.

The detector comprises the temperature signal acquisition equipment, the current signal acquisition equipment and a host computer. The current signal acquisition equipment comprises an AC transformer and a Programmable Logic Controller (PLC). The output terminal of the AC transformer is connected to the input terminal of the PLC, and the output terminal of PLC is connected to the host computer. The temperature signal acquisition equipment comprises an imaging device, a color sensor, two transceiver integrated circuits and a serial communication circuit. The imaging device comprises an objective lens and an eyepiece. The transceiver integrated circuit comprises a microcontroller and a RF transceiver. One RF transceiver of the two transceiver integrated circuits works as transmitter, and the other works as an acceptor. The input terminal of the color sensor is connected to the imaging device. In the first group transceiver integrated circuit the output terminal of the color sensor is connected to the input terminal of the microcontroller, and the output terminal of the microcontroller is connected to the input terminal of the RF transmitter. The output terminal of the RF transmitter is connected to the input terminal of the RF receiver in the second group transceiver integrated circuit by wireless network. The output terminal of the RF receiver is connected to the input terminal of the microcontroller in the second group of transceiver integrated circuit. The output terminal of the microcontroller is connected to the input terminal of the serial communication circuit. The output terminal of the serial communication circuit is connected to the host computer. The objective lens of the imaging device aims the measured target. The photosensitive sensor is fixed in the eyepiece at one end, so that the measured target radiation light can be projected to the photosensitive parts of the color sensor by the imaging device. The color sensor is connected to the microcontroller. When collecting the signal, the microcontroller controls the RF transmitter circuit to transmit wireless RF signals. The RF receiver circuit controls the serial communication circuit to send data to the host computer under the coordination of the microcontroller after receiving signals. Two identical transceiver integrated circuits are used to transmit and receive wireless signals and to play a different role in the control of the microcontroller. The configuration software of the host computer has the function of real-time display, history enquiry, data storage and alarm processing, etc.

Field data are transmitted to the host computer by two acquisition equipments. The host computer calculates and analyzes the field data by the method in the present invention to detect faults.

The function of each component of the fault detector is as follows:

(1) Current Signal Acquisition equipment: The current signal acquisition equipment comprises an AC transformer and a Programmable Logic Controller (PLC). The electric arc furnace has the characteristics of low voltage and high current, so the voltage of the wire between the transformer and the electric arc furnace is not high, but the current is very high. When the voltage is 100 V in the operating process, the current can be up to 10000 A, which is hard to measure.

Therefore, the AC transformer is used to transform the high current in the electrodes to the normal signal of 0~5 V. The AC transformer is connected to the input terminal of the PLC. After the PLC completes the analogue-to-digital conversion, current signals in the three electrodes are acquired by the PLC simultaneously, and then, the current signals are transmitted to the host computer by the serial ports of the PLC.

(2) Temperature Signal Acquisition equipment: The temperature signal acquisition equipment comprises an imaging device, a color sensor, a microcontroller, two transceiver integrated circuits and a serial communication circuit. The electromagnetic spectrum radiated by the high-temperature molten materials contains electromagnetic waves with all the wavelength frequency from infrared rays to ultraviolet rays. The electromagnetic waves with different wavelengths have different radiation intensity in different temperatures, which also contains the visible part. Two kinds of visible light with different wavelengths, such as red light and green light, have different ratios of the radiation intensity in different temperatures. Therefore, temperature can be measured by indirectly measuring the ratio of the radiation intensity of two kinds of visible light with different wavelengths. The temperature signal acquisition equipment is used to make the measured target radiation light projected to the photosensitive parts of the color sensor by the imaging device. The color sensor measures the radiation intensity of two kinds of visible light such as red light and green light with the help of the microcontroller. After the data are transmitted from the color sensor to the microcontroller, the transmitter circuit of the microcontroller transmits the data in the form of wireless signals. After the signals are received by the receiver circuit, the receiver circuit is controlled by the microcontroller to transmit the signals to the host computer through the serial communication circuit. The program to control the color sensor and to control the transmission of wireless data is written in the microcontroller at the sending end. The program to control serial communication and to receive wireless data is written in the microcontroller at the receiving end.

(3) Host Computer: After the data are transmitted to the host computer, firstly, the monitoring software transforms the data acquired by the color sensor to temperature data by the method of the colorimetric temperature measurement, and then, the current data and the temperature data are written into the database. At the same time, the current data and the temperature data as well as the history temperature curves thereof are displayed on the monitor interface. The host computer also detects faults of the operating process by analyzing the history data.

The host computer needs to calculate the data to obtain the related temperature after the host computer receives the signals of radiation intensity of the two kinds of visible light such as red light and green light, and the method of the colorimetric temperature measurement is as follows:

Based on Planck's law of radiation:

$$M(\mu, T) = \epsilon(\mu, T) c_1 \cdot \mu^{-5} / (e^{c_2/(\mu \cdot T)} - 1) \quad (1)$$

In the equation (1), $\mu$ is the wavelength of the electromagnetic wave, $M(\mu, T)$ is the spectral radiant emittance, $\epsilon(\mu, T)$ is the gray body emissivity, T is degree Kelvin, $c_1$ is the first thermal radiation constant, $c_2$ is the second thermal radiation constant, and e is Natural logarithm.

When $c_2/(\mu \cdot T) \gg 1$, Planck's law can be superseded by Wien's law, then $$M(\mu, T) = \epsilon(\mu, T) c_1 \cdot \mu^{-5} \cdot e^{-c_2/(\mu \cdot T)} \quad (2)$$

When two wavelengths $\mu_1, \mu_2$ are given, the corresponding spectral radiant emittances are:

$$M(\mu_1, T) = \epsilon(\mu_1, T) c_1 \cdot \mu_1^{-5} \cdot e^{-c_2/(\mu_1 \cdot T)} \quad (3)$$

$$M(\mu_2, T) = \epsilon(\mu_2, T) c_1 \cdot \mu_2^{-5} \cdot e^{-c_2/(\mu_2 \cdot T)} \quad (4)$$

The temperature measurement equation can be obtained by comparing the equations (3) and (4) above:

$$T = \frac{c_2 \cdot (1/\mu_2 - 1/\mu_1)}{\ln(M(\mu_1, T)/M(\mu_2, T)) - \ln(\epsilon_1/\epsilon_2) - 5\ln(\mu_2/\mu_1)} \quad (5)$$

The spectral radiant emittances of different wavelengths gathered by red filter and green filter are used as the input of equation (5). Because the wavelengths of two colors are approximate, the ratio of the gray body emissivity is approximately 1, so that the equation can be simplified as:

$$T = \frac{c_2 \cdot (1/\mu_2 - 1/\mu_1)}{\ln(M(\mu_1, T)/M(\mu_2, T)) - 5\ln(\mu_2/\mu_1)} \quad (6)$$

The electric arc furnace has multiple modes in the operating process. There always exits a stable working state in every mode. The current data and the temperature data will change when the work mode switches, leading to omission and misstatement of fault diagnosis. The present invention provides a multimode fault diagnosis method which can intelligently recognize the current operating mode when the operating mode changes and diagnose the fault for this mode.

The fault detection device of the electric arc furnace is used to take multimode fault monitoring and diagnosis, and it comprises the following steps:

Step 1: Acquiring and standardizing data. M operating modes are supposed in the operating process of the electric arc furnace. Three-phase current $I_A$, $I_B$ and $I_C$ in the M operating modes and temperature t in the electric arc furnace are acquired when the electric arc furnace operates steadily in different modes. Then, the initial dataset $\dot{X}_m = [x_{1,m}^T, x_{2,m}^T, \ldots, x_{l,m}^T \ldots, x_{N_m}^T]^T (N_m \times J)$ (m=1, 2, ..., M) is obtained, where the subscript m is the $m^{th}$ operating mode, $N_m$ is the number of the data sample in the $m^{th}$ operating mode, and J is the number of the variables which is defined as 4 in the present invention. To explain the calculating method clearly, J is still used. The initial dataset is standardized by the methods of calculating the average and standard deviation, and then, the standard dataset $X_m = (N_m \times J)$ (m=1, 2, ..., M) in the normal operation state can be obtained.

Step 2: Decompose the data and establish the preliminary monitoring model for the operating process of the electric arc furnace. The M datasets are obtained in Step 1 by standardized. And then build the preliminary monitoring model for the operating process of the electric arc furnace, that calculate the global main factor matrix $P_g$ under the M different operating modes of the monitoring model to decompose the datasets. The datasets is obtained in the M different operating modes of the electric arc furnace. Then close common subsets in these M operating modes and special subsets of every operating mode are obtained.

To establish the preliminary monitoring model for the operating process of the electric arc furnace, the modeling has the following two steps of:

1. Calculating the global main factor matrix $P_g$ for the operating process of the electric arc furnace.

The datasets in different operating modes of the electric arc furnace have the same variable correlation. The linear combination of the global main factor can represent other samples and can even replace all the other samples. The global main factors can also represent the main characteristic of the initial data, the differences of data distribution and the change information of themselves. Therefore, the global main factors for the operating process of the electric arc furnace can be used as the similarity evaluation index of datasets for different operating modes.

In the operating process of the electric arc furnace, the main factor of dataset of every operating mode are defined as $p_m$ (m=1, 2, ..., M), where the subscript m represents the number of different operating modes. The relation between the main factor $p_m$ of dataset of every operating mode and this dataset is:

$$p_m = \sum_{n=1}^{N_m} a_{n,m} x_{n,m} = X_m^T \alpha_m \qquad (7)$$

$\alpha_m = [a_{1,m}, a_{2,m}, \ldots, a_{n,m}]^T$ is the linear combination coefficient, where the letter n represents the number of rows of $\alpha_m$, i.e., $p_m$ can be represented as the linear combination of the $N_m$ vectors of $X_m$. Then, the global main factor for the operating process of the electric arc furnace $p_g$ is introduced, and make it approximates to the main factor of the dataset obtained in each operating mode of the electric arc furnace. Global main factor $p_g$ is used to describe the main factor of the dataset of each operating mode. The method to obtain $p_g$ is as follows:

To make $p_g$ sufficiently approximate to $p_{m,j}$ which is the main factor of the subset for each operating mode of the electric arc furnace, $(p_g^T X_m^T \alpha_m)^2$ is maximized, and $R^2 = (p_g^T X_1^T \alpha_1)^2 + (p_g^T X_2^T \alpha_2)^2 + \ldots + (p_g^T X_M^T \alpha_M)^2$ is introduced. Then, the problem changes to calculating the maximum of $R^2$. At the same time, the inequality $$\varepsilon \leq \frac{(p_g^T X_1^T \alpha_1)^2}{(p_g^T X_2^T \alpha_2)^2} = \frac{(p_g^T X_2^T \alpha_2)^2}{(p_g^T X_3^T \alpha_3)^2} \leq \frac{1}{\varepsilon}$$

is introduced, where $\varepsilon$ is a constraint parameter and satisfies the condition of $0.8 \leq \varepsilon < 1$. To make $p_g$ sufficiently approximate to $p_{m,j}$, $\varepsilon$ is defined as 0.9 in the present invention. The problem changes to solve the following equation:

$$\max R^2 = \max \left( \sum_{m=1}^{M} (p_g^T X_m^T \alpha_m)^2 \right). \qquad (8)$$

Satisfy constraints are as follows:

$$s.t. \begin{cases} \varepsilon (p_g^T X_{m-1}^T \alpha_{m-1})^2 - (p_g^T X_m^T \alpha_m)^2 \leq 0 \\ \varepsilon (p_g^T X_m^T \alpha_m)^2 - (p_g^T X_{m-1}^T \alpha_{m-1})^2 \leq 0 \\ p_g^T p_g = 1 \\ \alpha_m^T \alpha_m = 1. \end{cases} \qquad (9)$$

The present invention deals with fault diagnosis for the different operating modes of the electric arc furnace. Different mode is reflected in the different raw materials. Raw materials will be adjusted due to production needs. When raw material is different, the current for normal production is also different, but it still operates in a stable state. To keep the generality, suppose there are two kinds of production modes corresponding to the two different kinds of raw materials A and B. Then, mode A and mode B respectively represent the operating modes of the electric arc furnace, of which the raw material is material A and material B respectively. That is to say M is equal to 2. To achieve the above objective, an initial objective function is introduced, and the maximum of the objective function is calculated as follows:

$$F(p_g, \alpha, \lambda) = (p_g^T X_A^T \alpha_A)^2 + (p_g^T X_B^T \alpha_B)^2 - \qquad (10)$$
$$\lambda_g(p_g^T p_g - 1) - \lambda_A(\alpha_A^T \alpha_A - 1) - \lambda_B(\alpha_B^T \alpha_B - 1) -$$
$$\lambda_1(\varepsilon(p_g^T X_A^T \alpha_A)^2 - (p_g^T X_B^T \alpha_B)^2) - \lambda_2(\varepsilon(p_g^T X_B^T \alpha_B)^2 - (p_g^T X_A^T \alpha_A)^2),$$

Where $\lambda_g, \lambda_A, \lambda_B, \lambda_1$ and $\lambda_2$ are constants. The partial derivative of $p_g$, $\alpha_A$ and $\alpha_B$ for $F(p_g, \alpha, \lambda)$ in above equation is solved to obtain the following equations respectively:

$$(1 - \lambda_1 \varepsilon + \lambda_2) X_A^T X_A p_g + (1 - \lambda_2 \varepsilon + \lambda_1) X_B^T X_B p_g = \lambda_g p_g \qquad (11)$$

$$\alpha_A = \sqrt{\frac{(1 - \lambda_1 \varepsilon + \lambda_2)}{\lambda_A}} X_A p_g = \sqrt{\frac{1}{p_g^T (X_A^T X_A) p_g}} X_A p_g \qquad (12)$$

$$\alpha_B = \sqrt{\frac{(1 - \lambda_2 \varepsilon + \lambda_1)}{\lambda_B}} X_B p_g = \sqrt{\frac{1}{p_g^T (X_B^T X_B) p_g}} X_B p_g \qquad (13)$$

$\lambda_A$ and $\lambda_B$ can be calculated from equations (11), (12) and (13):

$$\lambda_A = (1 - \lambda_1 \varepsilon + \lambda_2) p_g^T (X_A^T X_A) p_g \qquad (14)$$

$$\lambda_B = (1 - \lambda_2 \varepsilon + \lambda_1) p_g^T (X_B^T X_B) p_g \qquad (15)$$

The equation (11) is analyzed to calculate $p_g$. Based on the previously mentioned inequality, $p_g$ should meet the following conditions:

$$\begin{cases} \lambda_1(\varepsilon(p_g^T X_A^T \alpha_A)^2 - (p_g^T X_B^T \alpha_B)^2) = 0, & (16) \\ \lambda_2(\varepsilon(p_g^T X_B^T \alpha_B)^2 - (p_g^T X_A^T \alpha_A)^2) = 0, & (17) \\ \lambda_1, \lambda_2 \geq 0. \end{cases}$$

Equations (12) and (13) are submitted into equations (16) and (17) to obtain the result as follows:

$$\begin{cases} \lambda_1(\varepsilon p_g^T (X_A^T X_A) p_g - p_g^T (X_B^T X_B) p_g) = 0, & (18) \\ \lambda_2(\varepsilon p_g^T (X_B^T X_B) p_g - p_g^T (X_A^T X_A) p_g) = 0, & (19) \\ \lambda_1, \lambda_2 \geq 0. \end{cases}$$

In above equation, in order to calculate $p_g$, the values of $\lambda_1$ and $\lambda_2$ are analyzed as follows:

(1) If $\lambda_1 \neq 0$ and $\lambda_2 \neq 0$, the equations (18) and (19) are contradictory. Therefore, the equation has no solution in this case.

(2) If $\lambda_1 = 0$ and $\lambda_2 = 0$, the equations (18) and (19) are constantly equal to 0, i.e., equations (18) and (19) lose binding effect, and equation (11) can be rewritten as follows:

$$X_A^T X_A p_g + X_B^T X_B p_g = \lambda_g p_g \qquad (20)$$

From equation (20), calculating $p_g$ changes to calculating the eigenvector of $(X_A^T X_A + X_B^T X_B)$, by which the maximum of $(p_g^T X_A^T \alpha_A)^2+(p_g^T X_B^T \alpha_B)^2$ can be obtained. However, because equations (18) and (19) lose binding effect, $p_g$ may not sufficiently approximate to the main factor of the subset for every mode. Therefore, the solution $p_g$ cannot meet requirements.

(3) If $\lambda_1=0$ and $\lambda_2\neq 0$, from equations (18) and (19), the following equation is obtained:

$$\epsilon p_g^T X_B^T X_B p_g - p_g^T X_A^T X_A p_g = 0 \quad (21)$$

Where the parameters should meet the condition of $0.8 \leq \epsilon < 1$. Here, $\epsilon$ is defined as 0.9. Equation (21) has only one unknown vector $p_g$, and some groups of solution obtained by solving the equation (21) are as the solution of $p_g$, which is defined as $p_{g1}$.

(4) If $\lambda_1 \neq 0$ and $\lambda_2=0$, the same method is used, and the following equation is obtained:

$$\epsilon p_g^T X_A^T X_A p_g - p_g^T X_B^T X_B p_g = 0 \quad (22)$$

The analysis method similar to the method in step (3) is used to obtain the solution of another group of solution of $p_g$, which is defined as $p_{g2}$.

$p_{g1}$ and $p_{g2}$ can be the solutions of $p_g$ which meet the conditions. $p_{g1}$ and $p_{g2}$ are combined together to constitute a matrix $p_g=[p_{g1}, p_{g2}]$ of the R row, where the sum of the rows of $P_{g1}$ and $p_{g2}$ is R. Then, the global main factor matrix $P_g$ (J×R) for the operating process of the electric arc furnace is obtained as the solution which meets the assuming conditions.

2. Decomposed the dataset in the two working modes of the electric arc furnace working process.

The global main factor matrix $P_g$ (J×R) of the electric arc furnace operating process is obtained by the modeling above. The column vectors of $P_g$ should meet the linear conditions $p_g=X_A^T\alpha_1$ and $p_g=X_B^T\alpha_2$, where $\alpha_1$ and $\alpha_2$ are the linear combination coefficients, $p_g^T p_g=1$, $\alpha_1^T\alpha_1=1$, and $\alpha_2^T\alpha_2=1$. Then, the equations above can be transformed to $\alpha_1=X_A P_g$ and $\alpha_2=X_B P_g$. R groups of linear combination coefficients $\alpha_1$ and $\alpha_2$ are made respectively to constitute the score matrices $T_A^C$ and $T_B^C$ of the two common subsets, and the following equation can be obtained:

$$T_A^C = X_A P_g, T_B^C = X_B P_g \quad (23)$$

By the following calculation, the dataset $X_A$ for mode A of the electric arc furnace can be decomposed into the common dataset $X_A^C$ containing common information and the special dataset $X_A^S$.

$$\begin{cases} X_A = X_A^C + X_A^S \\ X_A^C = T_A^C P_g^T = X_A P_g P_g^T \\ X_A^S = X_A - X_A^C = X_A^T(I - P_g P_g^T). \end{cases} \quad (24)$$

The dataset $X_B$ for mode B of the electric arc furnace can be decomposed into the common dataset $X_B^C$ and special dataset $X_B^S$ in the same method.

$$\begin{cases} X_B = X_B^C + X_B^S \\ X_B^C = T_B^C P_g^T = X_B P_g P_g^T \\ X_B^S = X_B - X_B^C = X_B^T(I - P_g P_g^T). \end{cases} \quad (25)$$

After the decomposition above is completed, the preliminary monitoring model of the electric arc furnace operating process is established.

Step 3: Monitoring and diagnosing the fault of the electric arc furnace operating process; the preliminary monitoring model of the electric arc furnace is used to calculate the $T^2$ statistics and the SPE statistics.

The score matrices $T_A^S$ and $T_B^S$ of special parts of two modes datasets and the residual error matrices $E_A^S$ and $E_B^S$ of the special parts can be obtained combination of Principal Component Analysis (PCA) algorithm.

$$\begin{cases} T_A^S = X_A^S P_A^S = X_A(I - P_g P_g^T) P_A^S \\ \hat{X}_A^S = T_A^S (P_A^S)^T \\ E_A^S = X_A^S - \hat{X}_A^S \end{cases} \quad (26)$$

$$\begin{cases} T_B^S = X_B^S P_B^S = X_B(I - P_g P_g^T) P_B^S \\ \hat{X}_B^S = T_B^S (P_B^S)^T \\ E_B^S = X_B^S - \hat{X}_B^S. \end{cases} \quad (27)$$

Where $\hat{X}_A^S$ and $\hat{X}_B^S$ are respectively the estimated matrices of $X_A^S$ and $X_B^S$, $P_A^S$(J×$R_A^S$) and $P_B^S$(J×$R_B^S$) are respectively the PCA loading matrices of two special subsets, $R_A^S$ and $R_B^S$ are respectively the number of principle components for each subset, and $E_A^S$ and $E_B^S$ are respectively the residual errors of the special subsets and also the residual errors of the final model. The loading matrices $P_A^S$ and $P_B^S$ of special subsets for mode A and mode B of the electric arc furnace are calculated as follows:

$$\frac{1}{N_A-1}(X_A^S(X_A^S)^T)P_A^S = \gamma_A P_A^S \quad (28)$$

$$\frac{1}{N_B-1}(X_B^S(X_B^S)^T)P_B^S = \gamma_B P_B^S. \quad (29)$$

Where $$\frac{1}{N_A-1}(X_A^S(X_A^S)^T) \text{ and } \frac{1}{N_B-1}(X_B^S(X_B^S)^T)$$

are the covariance matrices of datasets of mode A and mode B of the electric arc furnace, $\gamma_A$ and $\gamma_B$ are respectively the eigenvalues of the covariance matrices, and $P_A^S \in R^{J\times 1}$ and $P_B^S \in R^{J\times 1}$ are respectively consist of the eigenvectors of the covariance matrices of mode A and mode B of the electric arc furnace.

The datasets for mode A and mode B are decomposed into common datasets and special datasets, that is to say, $X_A^C$ and $X_A^S$ obtained from equation (24), and $X_B^C$ and $X_B^S$ obtained from equation (25). Then, the diagonal matrix which consists of these four matrix eigenvalues is calculated as follows:

The eigenvalue of $X_A^C$ is supposed to be $\phi$, so the characteristic polynomial of $X_A^C$ is $|\phi \cdot E - X_A^C|$ where E is the unit matrix. Make the characteristic polynomial equal to zero, that is to say, $|\phi \cdot E - X_A^C|=0$. Then, the characteristic equation $G(\phi)=0$ whose variable is $\phi$ can be obtained. By solving this characteristic equation, the eigenvalue of $X_A^C$ can be obtained. The eigenvalue of $X_A^C$ is used as the diagonal elements to obtain the diagonal matrix $\Lambda_A^C$ and diagonal matrixes $\Lambda_A^S$, $\Lambda_B^C$ and $\Lambda_B^S$ which consist of the eigenvalues of another three matrixes $X_A^S$, $X_B^C$ and $X_B^S$ can be obtained in the same method.

Fault detection analysis is performed in the common datasets and the special datasets of mode A and mode B respectively. In statistical process monitoring, based on the principle of hypothesis testing to determine whether the failure occurred in the process, and the Hotelling ($T^2$) statistics and the squared prediction error (SPE) statistics are used for fault detection, and faults can be detected by plotting control charts.

$X_{new}$(J×1) is the new observation data of the electric arc furnace operating process. By projecting $X_{new}$ to the global main factor $P_g$, the common datasets score vector of the new sample data for two modes $t_{new}{}^C = P_g{}^T x_{new}$ can be obtained. At the same time, the $T^2$ statistics $T_{C,A}{}^2$ and $T_{C,B}{}^2$ of common parts of mode A and mode B can be obtained by the following equations (30) and (31). The $T^2$ statistics of the common parts of the two modes are calculated as follows.

$$T_{C,A}{}^2 = (t_{new}{}^C)^T (\Lambda_A{}^C)^{-1} t_{new}{}^C \qquad (30)$$

$$T_{C,B}{}^2 = (t_{new}{}^C)^T (\Lambda_B{}^C)^{-1} t_{new}{}^C \qquad (31)$$

The scores of the special subsets of the electric arc furnace operating process, to $t_{A,new}{}^S = (P_A{}^S)^T x_{new}$ and $t_{B,new}{}^S = (P_B{}^S)^T x_{new}$, are calculated in the similar method. Meanwhile, equations (32) and (33) below are used to calculate the $T^2$ statistics of the special subsets of mode A and mode B.

$$T_{S,A}{}^2 = (t_{A,new}{}^S)^T (\Lambda_A{}^S)^{-1} t_{A,new}{}^S \qquad (32)$$

$$T_{S,B}{}^2 = (t_{B,new}{}^S)^T (\Lambda_B{}^S)^{-1} t_{B,new}{}^S \qquad (33)$$

$\Lambda_A{}^S$ and $\Lambda_B{}^S$ respectively represent the diagonal matrixes which consist of the eigenvalues of the special subsets.

To calculate the final residual errors $e_{A,new}{}^S$ and $e_{B,new}{}^S$, $\hat{x}_{A,new}{}^S$ and $\hat{x}_{B,new}{}^S$ are supposed to be the estimated values of $x_{new}{}^S$ in mode A and mode B. $\hat{x}_{A,new}{}^S$, $\hat{x}_{B,new}{}^S$ and $x_{new}{}^S$ are submitted into equations (26) and (27) to obtain following equations:

$$e_{A,new}{}^S = x_{new}{}^S - \hat{x}_{A,new}{}^S = (I - [P_g, P_A{}^S][P_g, P_A{}^S]^T) x_{new} \qquad (34)$$

$$e_{B,new}{}^S = x_{new}{}^S - \hat{x}_{B,new}{}^S = (I - [P_g, P_B{}^S][P_g, P_B{}^S]^T) x_{new} \qquad (35)$$

The SPE statistics $SPE_{A,new}{}^S$ and $SPE_{B,new}{}^S$ of mode A and mode B are calculated by the residual errors as follows:

$$SPE_{A,new}{}^S = (e_{A,new}{}^S)^T e_{A,new}{}^S \qquad (36)$$

$$SPE_{B,new}{}^S = (e_{B,new}{}^S)^T e_{B,new}{}^S \qquad (37)$$

The control limit of the Hotelling $T^2$ statistics is calculated as follows:

$$T^2_{lim,A} = \frac{p \cdot (n_A - 1)}{n_A - p} F(p, n_A - 1, \alpha) \qquad (38)$$

$$T^2_{lim,B} = \frac{p \cdot (n_B - 1)}{n_B - p} F(p, n_B - 1, \alpha). \qquad (39)$$

Where $F(p, n_A-1, \alpha)$ represents F distribution, of which the confidence limit is $\alpha$, and degrees of freedom are respectively P and $n_A-1$; $F(p, n_B-1, \alpha)$ represents F distribution, of which the confidence limit is $\alpha$, and degrees of freedom are respectively p and $n_B-1$.

In the residual subspace, the control limit of the SPE statistics $SPE^A$ and $SPE^B$ of mode A and mode B can be calculated by the equations as follows:

$$SPE^A \sim g^A \chi_{h^A}{}^2 \qquad (40)$$

$$SPE^B \sim g^B \chi_{h^B}{}^2 \qquad (41)$$

Where $\chi_{h^A}{}^2$ represents $\chi^2$ distribution, of which the degree of freedom is $h^A$. $g^A = b^A/2a^A$, $h^A = 2(a^A)^2/b^A$, $a^A$ and $b^A$ are respectively the SPE estimated mean and variance of mode A in normal operation. $\chi_{h^B}{}^2$ represents $\chi^2$ distribution, of which the degree of freedom is $h^B$. $g^B = b^B/2a^B$, $h^B = 2(a^B)^2/b^B$, $a^B$ and $b^B$ are respectively the SPE estimated mean and variance of mode B in normal operation.

The $T^2$ statistics and the SPE statistics are used for the fault monitoring. By comparing the control charts plotted respectively in mode A and mode B, the current operating mode of the electric arc furnace can be determined, and online fault detection can be performed in the corresponding operating mode. When the $T^2$ statistics and the SPE statistics of the corresponding operating mode go beyond the control limits, some fault may occur, otherwise, the whole operating process is normal.

The advantage of present invention is: This device uses the radiation thermometry method can conduct long-range non-contact temperature measurement; and because the radiation intensity of two different kinds of visible light can be acquired, the colorimetric temperature measurement can be used to improve the calculation accuracy; the wireless communication protocol can form the wireless sensor network to make field wiring convenient, and the receiving and responding mechanism is used to ensure the accuracy of data transmission, and when communication failures occur due to the special situation, this mechanism also can intelligently determine the cause of the error and attempts to restore communication; the microcontroller of the receiving end realizes the same communication protocol as the PLC and makes different equipment compatible; this invention is suitable for working in a variety of different stable modes of industrial production process and it can identify the current operating mode of the electric arc furnace intelligently, and can diagnose faults for this work mode; this device has a good human-computer interface which can display temperature history curves to show the temperature change trend intuitively in the operating process, and it has the alarm function as well.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

In the embodiment, the type of the controller is CC2430. The type of the RF transceiver is CC2591. The AC transformer is a LYM-0.5 bus type low voltage current transformer. The type of the PLC is Siemens S7-200. The imaging device is a telescope. The type of the color sensor is TCS320.

Figure 1:
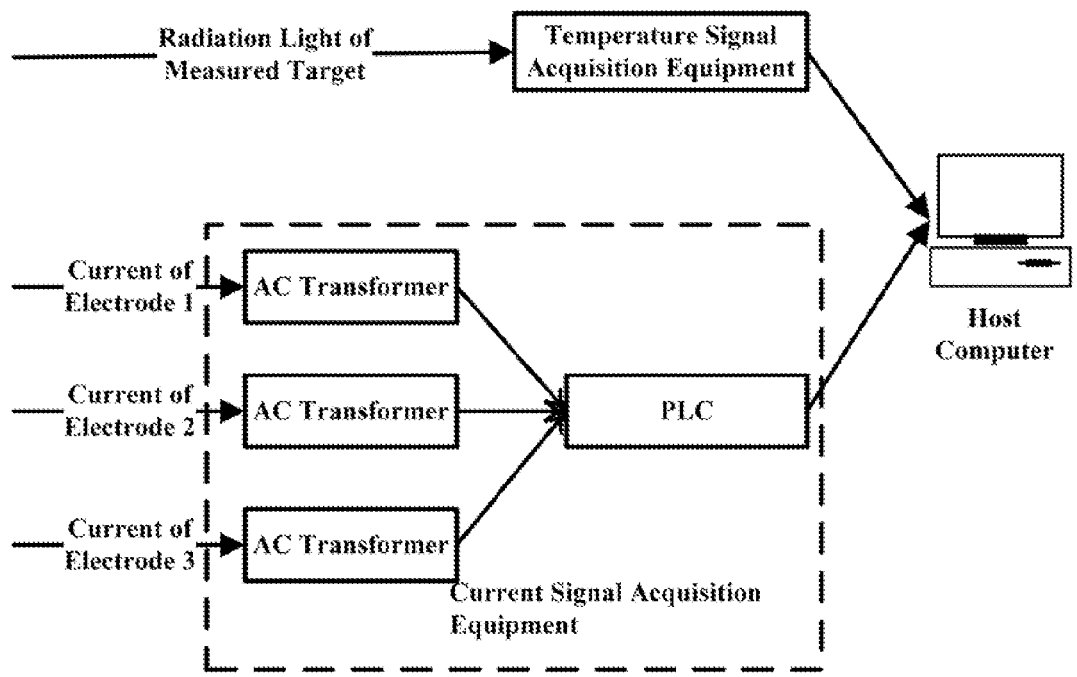
FIG. 1 is the overall structural diagram of the fault detector in the present invention.
Figure 2:
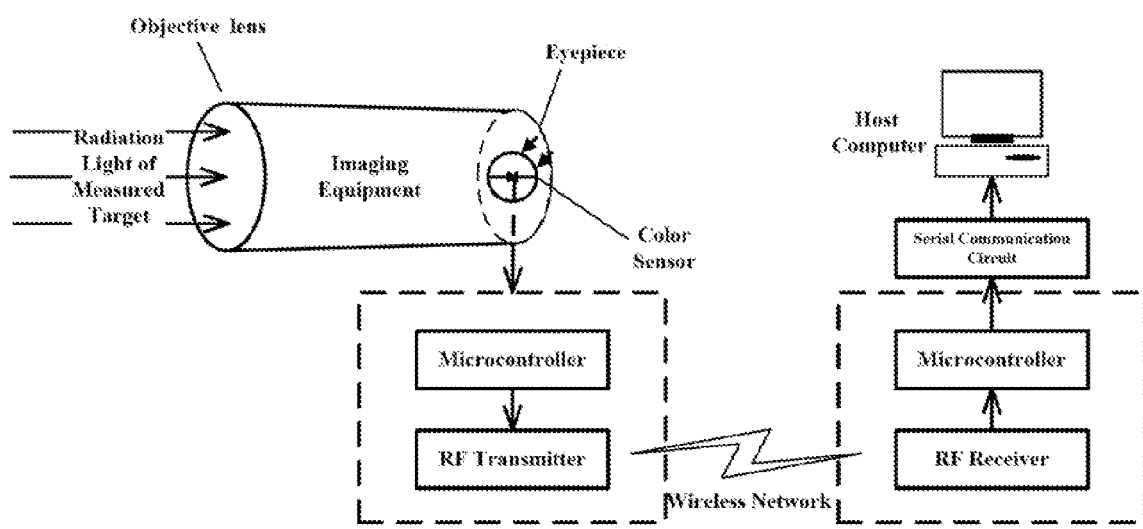
FIG. 2 is the temperature signal acquisition equipment structural diagram in the present invention.
Figure 5:
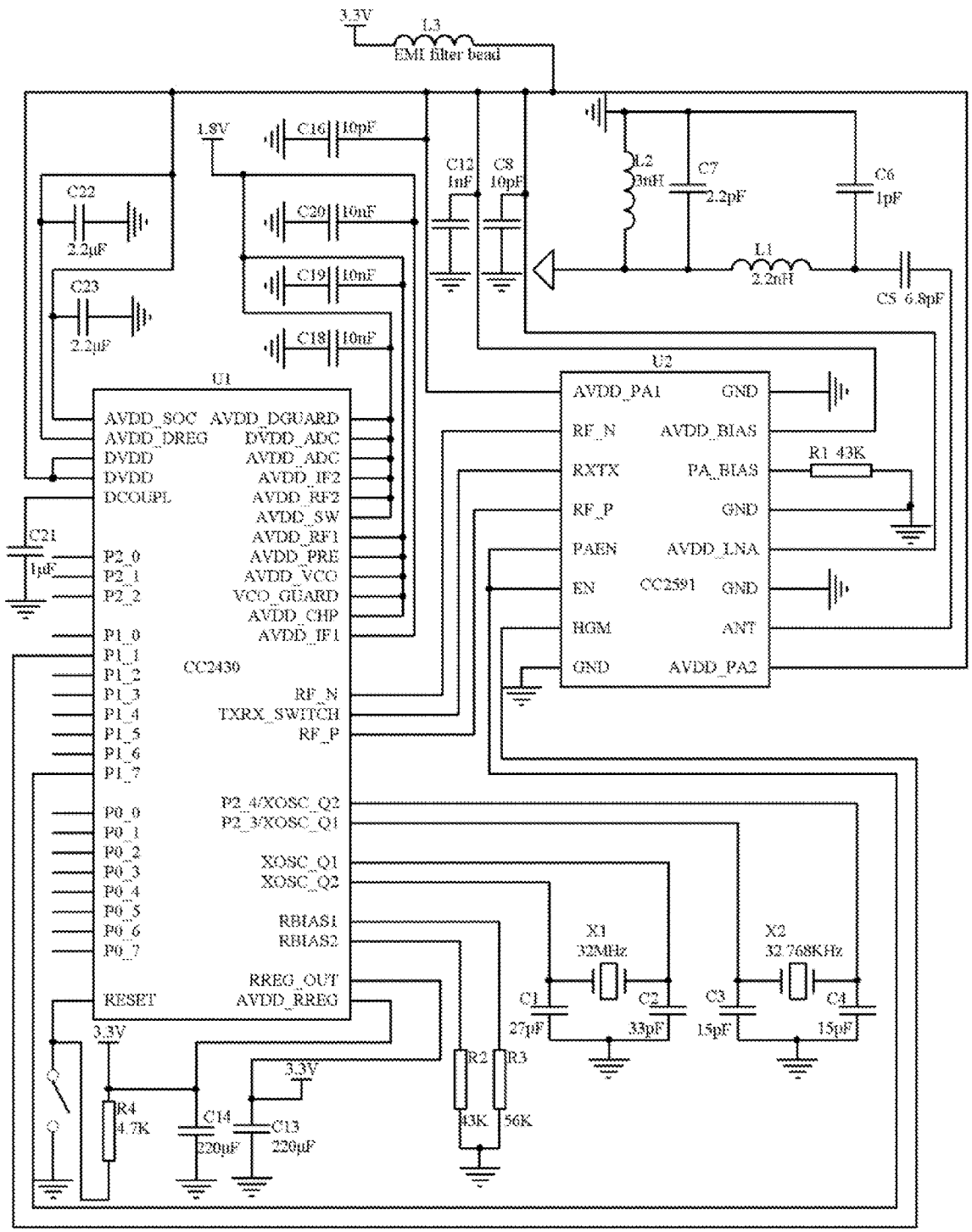
FIG. 5 is the transceiver integrated circuit schematic in the present invention.
Figure 6:
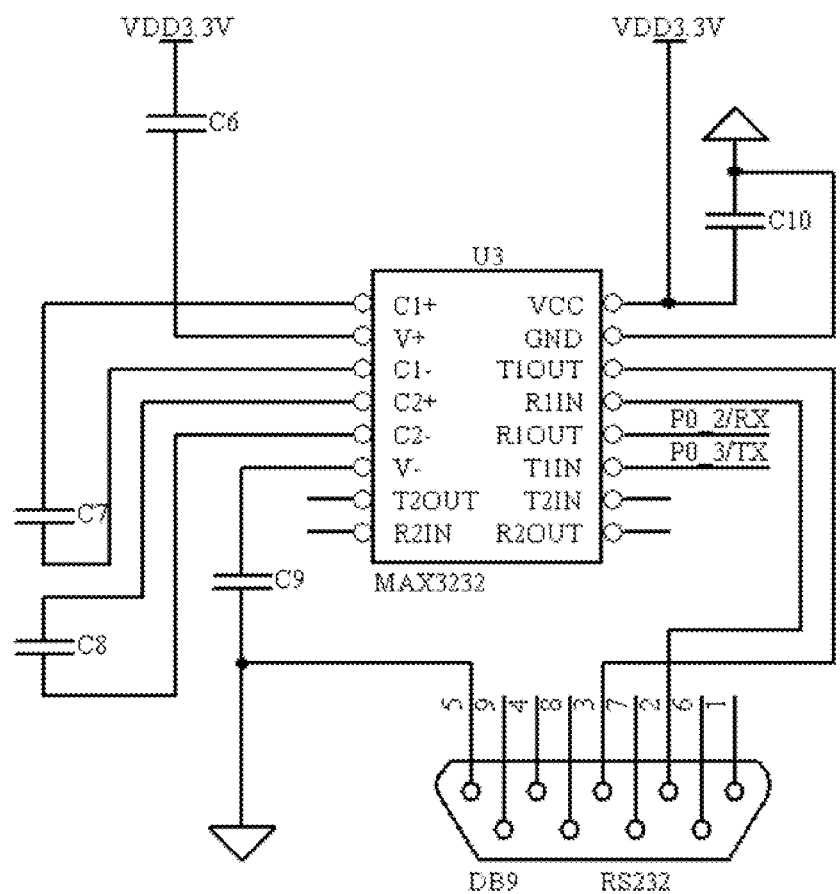
FIG. 6 is the serial communication circuit schematic in the present invention.

As shown in FIG. 1, the fault detector comprises the temperature signal acquisition equipment, the current signal acquisition equipment and a host computer. The current signal acquisition equipment comprises an AC transformer and a PLC. The AC transformer is respectively connected with the three electrodes of the electric arc furnace in series. The large current signals which go through the electrodes is transformed into standard signals of 0 to 5 V, and then, the standard signals are transmitted to the analog input terminal of the PLC. After analogue-to-digital conversion by the PLC, the digital signals are transmitted to the host computer through the serial port of PLC. As shown in FIG. 2, the temperature signal acquisition equipment comprises an imaging device, a color sensor, two groups of transceiver integrated circuits and a serial communication circuit. The imaging device comprises an objective lens and an eyepiece; the transceiver integrated circuit comprises a microcontroller and a RF transceiver. Of two groups of transceiver integrated circuits, one RF transceiver works as a transmitter, and another RF transceiver works as a receiver. The input terminal of the color sensor is connected to the imaging device. The output terminal of the color sensor is connected to the input terminal of microcontroller of the first group transceiver integrated circuit. The transceiver integrated circuit is shown in FIG. 5. The output terminals of the microcontroller RF_N, TXRX_SWITCH, P1_1 and P1_7 are respectively connected to the input terminals of the RF transmitter RF_N, RF_P, HGM, EN and PAEN. The output terminal of the RF transmitter is connected to the input terminal of the RF receiver of the second group transceiver integrated circuit through wireless network. The output terminals of the RF receiver RF_N, RF_P, HGM, EN and PAEN are respectively connected to the input terminals of the microcontroller RF_N, TXRX_SWITCH, P1_1 and P1_7. The P0_2 terminal of the microcontroller is connected to the P0-2/RX terminal of the serial communication circuit. The P0_3 terminal of the microcontroller is connected to the P0-3/TX terminal of the serial communication circuit. The TIOUT and RIOUT terminals of the serial communication circuit are connected to the host computer. The serial communication circuit is shown in FIG. 6. The objective lens of the imaging device aims the measured target. The photosensitive sensor is fixed in the eyepiece at one end, so that the measured target radiation light can be projected to the photosensitive parts of the color sensor by the imaging device. The color sensor is connected to the microcontroller. When collecting the signal, the microcontroller controls the RF transmitter circuit to transmit wireless RF signals. The RF receiver circuit controls the serial communication circuit to send data to the host computer under the coordination of the microcontroller after receiving signals. Two identical transceiver integrated circuits are used to transmit and receive wireless signals and to play a different role in the control of the microcontroller. The configuration software of the host computer has the function of real-time display, history enquiry, data storage and alarm processing, etc.

Figure 3:
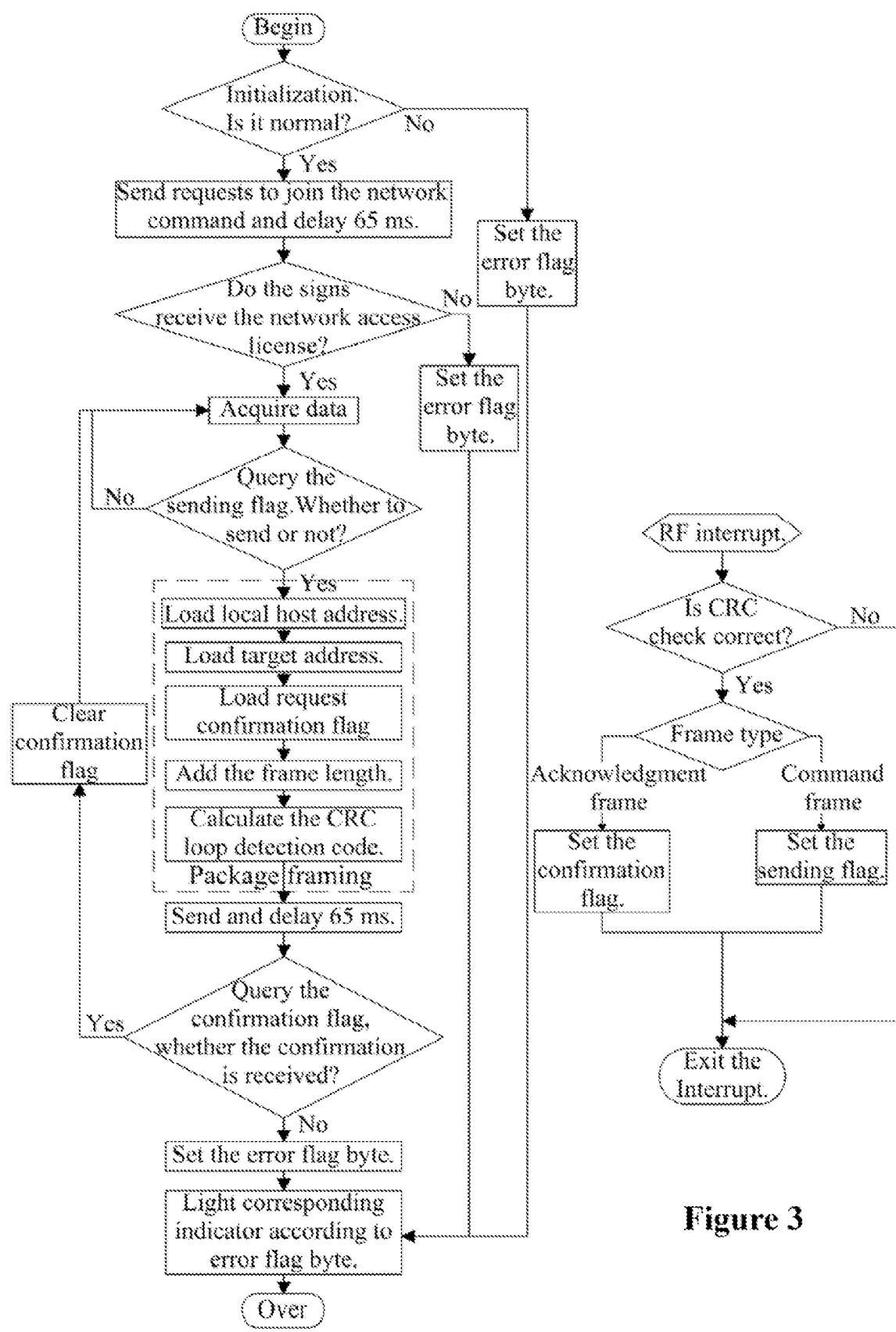
FIG. 3 is the sender controller program flowchart in the present invention.

In the electric arc furnace production site, the electromagnetic environment is complex. Therefore, the fault detector in the present invention uses the wireless network protocol based on IEEE 802.15.4 specification. The protocol has the functions of automatic search network, automatic recovery after errors and data transmission correction. The protocol is also used in the input terminal and the output terminal of the microcontroller, which ensures the accuracy of data transmission. The detail is shown in FIG. 3, the sender controller program flowchart. Acquired data are encapsulated as a frame by the microcontroller, including loading the local address, the target address and loading request confirmation flag, adding the frame length and calculating the CRC cycle test code. The transmitter circuit is provided by Texas Instruments Inc. and has the function of demodulation. The transmitter circuit contains RF SOC (system on Chip) chip CC2430 of microcontroller core 8051 and can support the IEEE 802.15.4 specification at the physical layer to ensure that data can be transmitted correctly.

Figure 4:
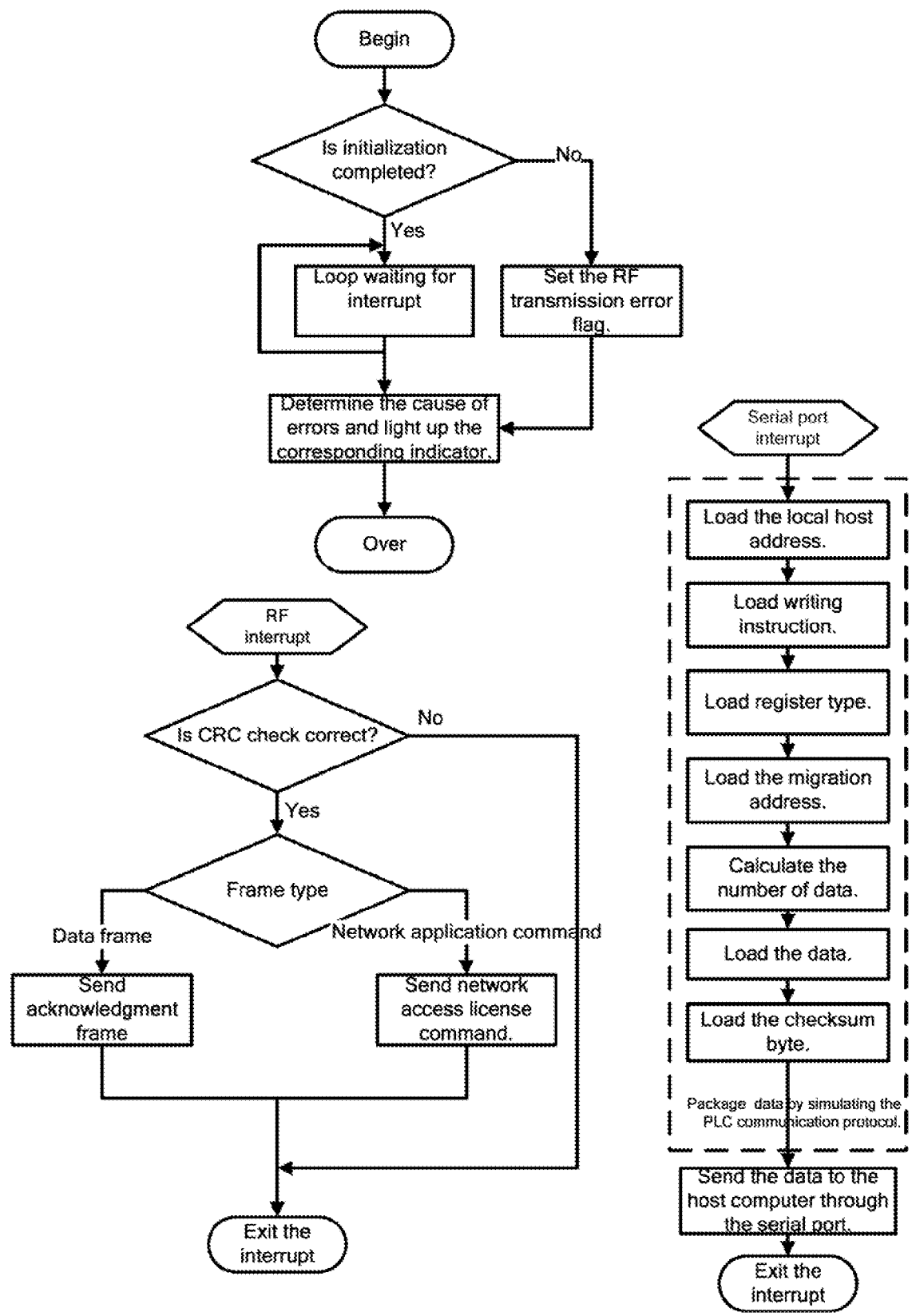
FIG. 4 is the receiver controller program flowchart in the present invention.

The communication protocol between S7-200 PLC and the configuration software is obtained by analyzing the communication process between S7-200 PLC and the configuration software, and the C language is used to realize the protocol on the input terminal of the microcontroller, and realizes the goal of device compatibility finally. The specific implementation method is shown in FIG. 4. The data are packaged according to the format of the communication between the PLC and the host computer before the data are transmitted, including loading the local address, write data command, registers type, offset address. Calculate the number of data, load data and load calibration bytes. After packaging, the data are transmitted to the host computer by the serial port.

Figure 7:
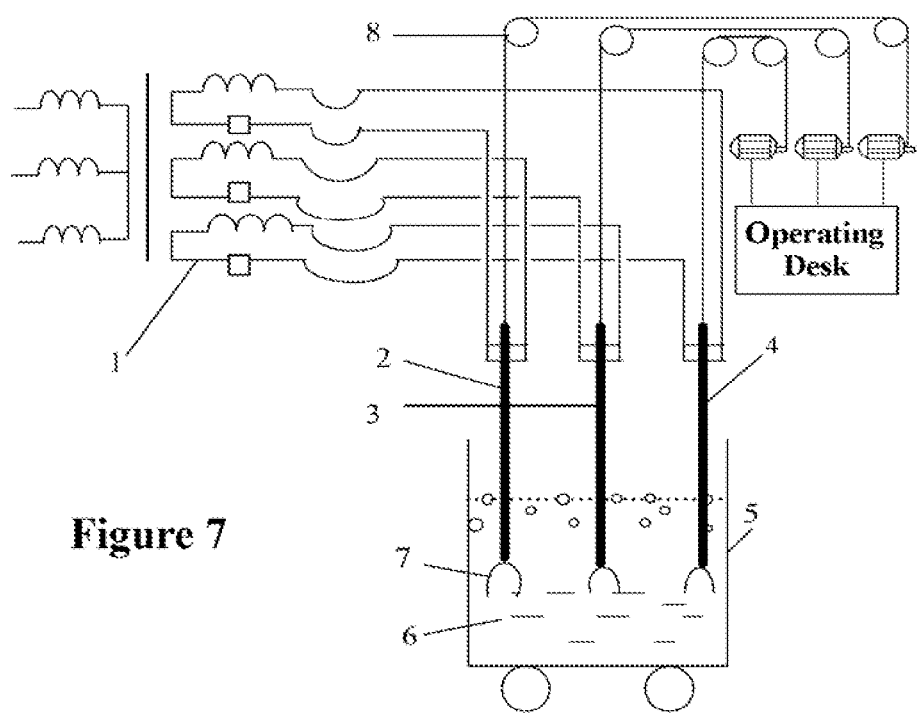
FIG. 7 is the electric arc furnace operating process schematic in the present invention.

Operating process of the electric arc furnace:

The schematic diagram of the operating process of the electric arc furnace is shown in FIG. 7. Number 1 is the current transformer. Number 2, 3 and 4 are three electrodes. Number 5 is the furnace wall. Number 6 is the molten pool. Number 7 is the discharged gas in the production process. Number 8 is the fixed pulley.

The imaging device, the color sensor and the transceiver integrated circuits are fixed in the supporting structure with the fixed pulley, and the objective aims at the molten pool. The transceiver integrated circuits, the serial communication circuit and the host computer are placed in the workbench. After start of the production, two kinds of red and green visible light signals radiated from the molten pool are acquired, and then, the signals are transmitted to the receiving circuit through the transceiver integrated circuits. Under the control of the microcontroller, the signals are transmitted to the host computer. The PLC and the current transformer are linked together to acquire current data and transmit the data to the host computer.

The electric arc furnace produces a lot of waste gas in the operating process. If too much gas is accumulated, the molten materials in the electric arc furnace may erupt and even cause failure of material spray. The raw materials of the electric arc furnace operating process include magnesium powder and magnesium pieces. Some of the data acquired for two modes are shown as follows, where mode A is corresponding to the magnesium powder and mode B is corresponding to the magnesium pieces.

TABLE 1

Some data of the modeling data in mode A

| | Variable | | | |
|---|---|---|---|---|
| No. | Current $I_A$ (Ampere) | Current $I_B$ (Ampere) | Current $I_C$ (Ampere) | Temperature t (Centigrade) |
| 1 | 8264.47 | 10434.55 | 8824.69 | 2853.2 |
| 2 | 8043.67 | 9955.90 | 8534.97 | 2860.4 |
| 3 | 8111.64 | 9807.76 | 8392.92 | 2858.5 |
| 4 | 8199.31 | 10056.70 | 8415.42 | 2861.1 |
| 5 | 8647.01 | 10402.67 | 8082.11 | 2866.7 |
| 6 | 8962.98 | 10682.08 | 7913.34 | 2855.4 |
| 7 | 8880.94 | 10739.74 | 8495.12 | 2864.3 |
| 8 | 8625.92 | 10835.38 | 8957.83 | 2860.9 |
| 9 | 8551.85 | 10704.11 | 8975.64 | 2850.5 |
| 10 | 8659.20 | 10614.10 | 8686.86 | 2855.7 |

TABLE 2

Some data of the modeling data in mode B

| | Variable | | | |
|---|---|---|---|---|
| No. | Current $I_A$ (Ampere) | Current $I_B$ (Ampere) | Current $I_C$ (Ampere) | Temperature t (Centigrade) |
| 1 | 11353.87 | 9858.86 | 9616.025 | 2816.3 |
| 2 | 11199.16 | 9947.46 | 9539.61 | 2820.5 |
| 3 | 11512.79 | 10553.63 | 11540.92 | 2826.8 |
| 4 | 11335.58 | 10410.64 | 10027.16 | 2830.1 |
| 5 | 11290.58 | 10220.31 | 9491.79 | 2837.2 |
| 6 | 11475.76 | 10212.81 | 10669.42 | 2835.9 |
| 7 | 11344.49 | 9866.36 | 9772.60 | 2840.4 |
| 8 | 11200.10 | 9642.74 | 9315.05 | 2833.3 |
| 9 | 11315.89 | 9970.90 | 9643.68 | 2844.7 |
| 10 | 11502.95 | 9994.81 | 10036.07 | 2839.3 |

By identifying the operating mode of the electric arc furnace, targeted fault detection is performed, and detecting results are analyzed.

Figure 14:
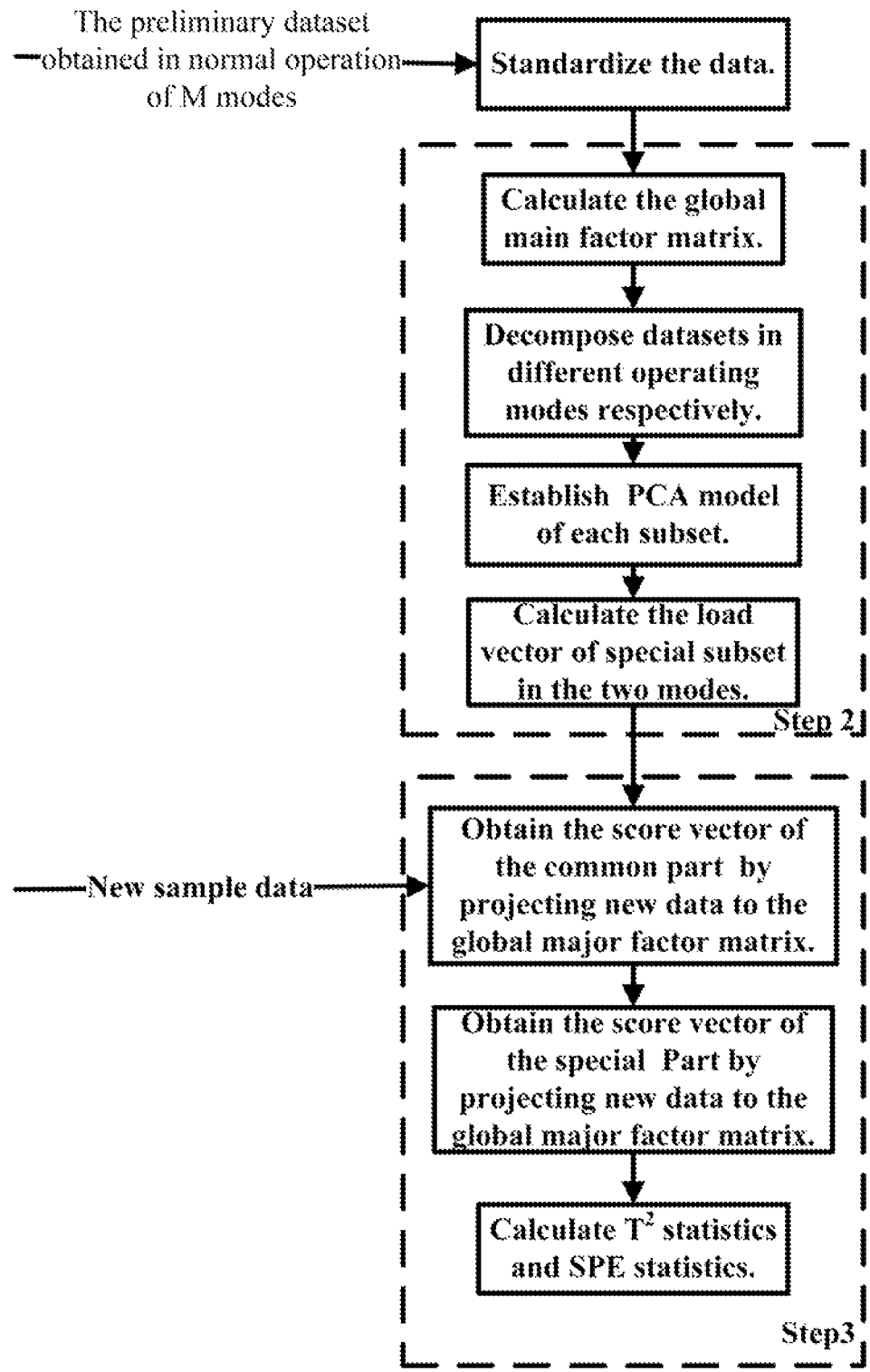
FIG. 14 is the flow chart of the fault diagnosis method.

The electric arc furnaces running fault detection device is used for multimode fault monitor and diagnosis. The multimode fault monitoring and diagnosis contains the following steps of (see FIG. 14):

Step 1: Acquiring and Standardizing Data.

The training data and the real-time data are acquired at the sampling interval of 1.2 seconds. The data in one of the normal operating modes are used to build mode A, the data in another normal operating mode is used to build mode B. In mode A, 349 sample points are selected, and in mode B, 403 sample points are selected, where the confidence limit is 99%. Each sample includes four variables, and the mean and the standard deviation is used to make data standard.

Step 2: Decomposing the data. The common part and the special part of the two modes are decomposed, and build models of two parts. Through calculating the model global factor matrix $P_g$ of the monitoring model for mode A and mode B, datasets obtained in mode A and mode B of the electric arc furnace are decomposed, and the common subsets with close relation and the special subsets of mode A and mode B are obtained.

The sample datasets in mode A and mode B are standardized. The global factor matrix $P_g$ is obtained through the methods mentioned above, and then, the datasets for mode A and the datasets for mode B are decomposed to obtain the common subsets and the special subsets. The PCA model is established for each subset. Loading vectors $P_A^S$ and $P_B^S$ of the special subsets for the two modes are calculated respectively. $x_{new}$ is supposed to be an available new sample in the observation data, and then, $x_{new}$ is projected by $P_g$ to get the score vector of the common part. $x_{new}$ is projected by $P_A^S$ and $P_B^S$ to obtain the score vector of the special part. Then, the $T^2$ statistics are obtained, and the SPE statistics are obtained by calculating the residual error.

Step 3: Fault detection and diagnosis are used for the operating process of the electric arc furnace.

Figure 8:
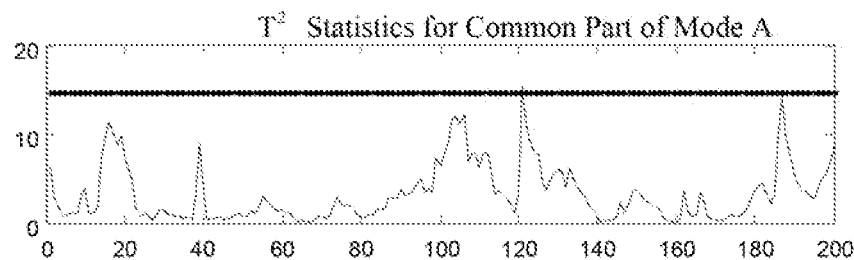
FIG. 8 is the control chart of the $T^2$ statistics of the common part of the dataset in normal operation.
Figure 8:
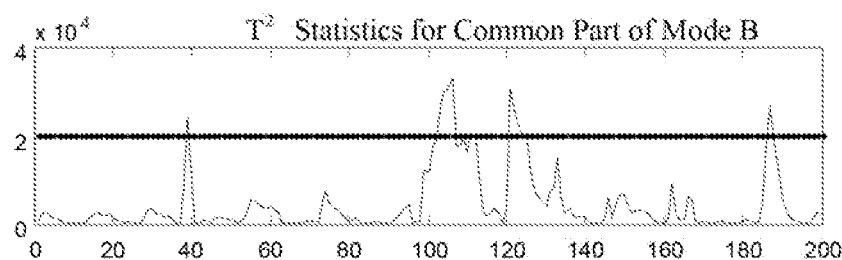
Figure 9:
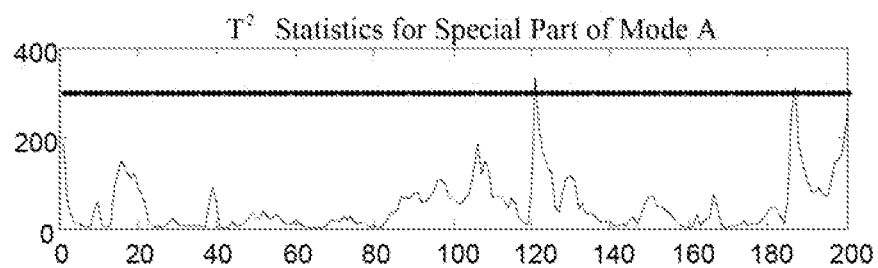
FIG. 9 is the control chart of the $T^2$ statistics of the special part of the dataset in normal operation.
Figure 9:
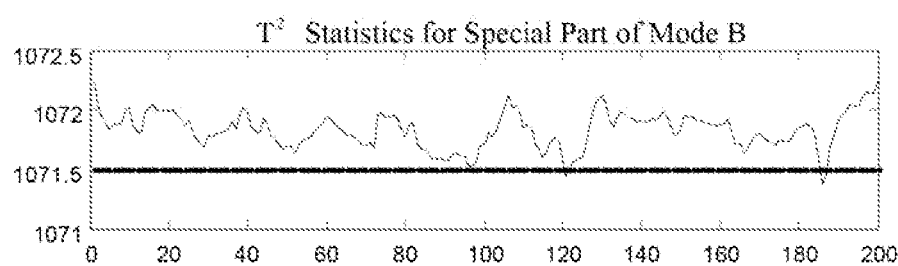
Figure 10:
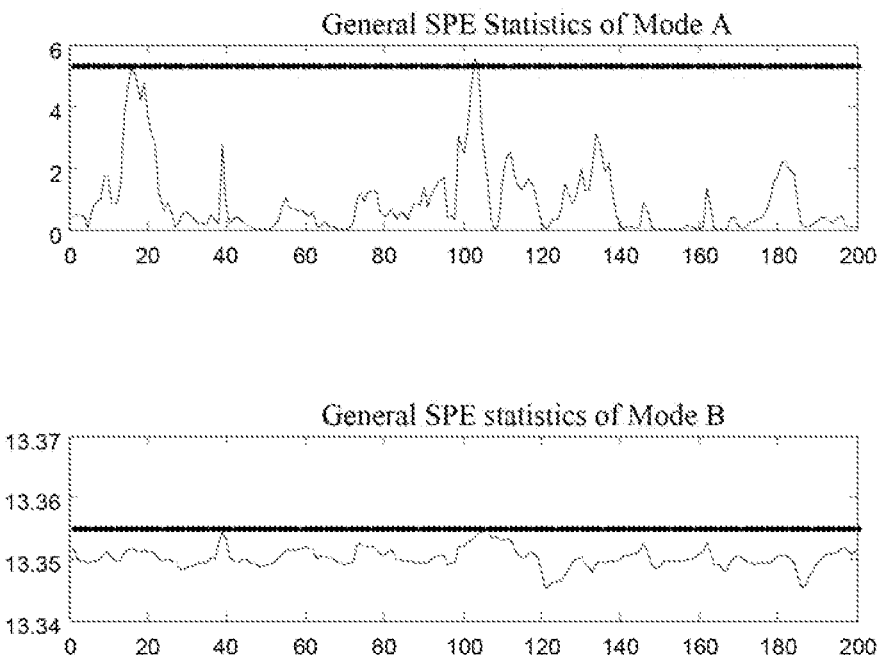
FIG. 10 is the control chart of the SPE statistics of the complete dataset in normal operation.

Normal operation data for mode A and mode B are selected. There are 349 sample points and 3 variable datasets for mode A, and there are 403 sample points and 3 variable datasets for mode B. Models of mode A and B are established respectively. First of all, a group of new observation is tested. As shown in FIG. 8 and FIG. 9, both the $T^2$ statistics of the common part and the $T^2$ statistics of the special part in mode A are not beyond the confidence area. However, the $T^2$ statistics of the special part in mode B is far beyond the control limit. As shown in FIG. 10, the SPE statistics of two modes are not beyond the control limit. Thus, it can determine the testing data is normal data. The comparison of the three figures shows that current data is much closer to mode A, and the current operating mode of the electric arc furnace can be determined in mode A.

Figure 11:
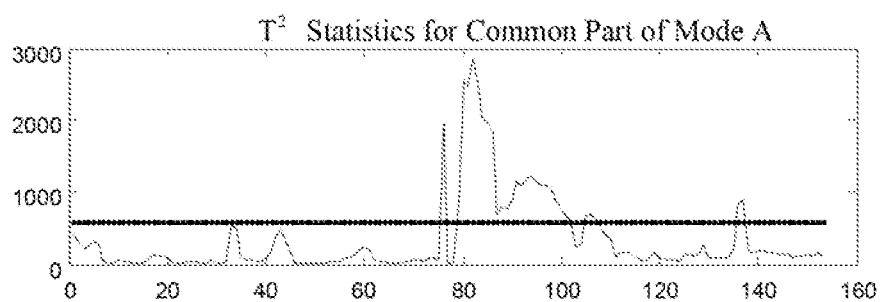
FIG. 11 is the control chart of the $T^2$ statistics of the common part of the new observation dataset.
Figure 12:
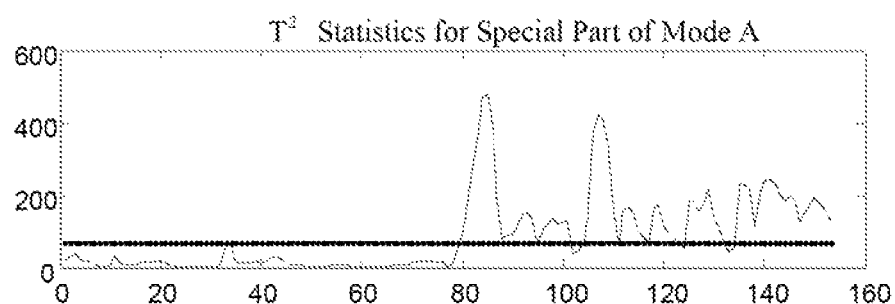
FIG. 12 is the control chart of the T2 statistics of the special part of the new observation dataset.
Figure 13:
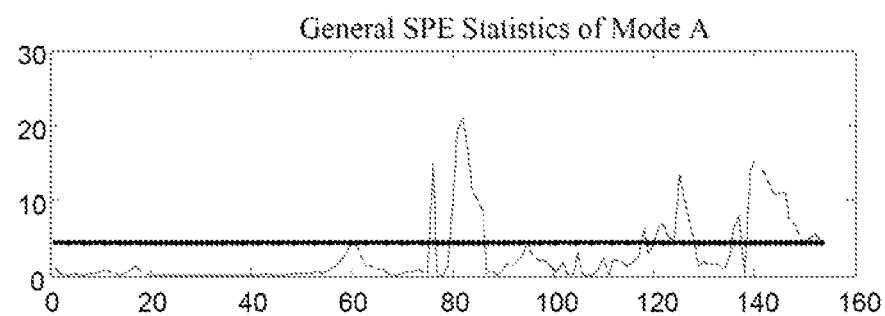
FIG. 13 is the control chart of the SPE statistics of the complete new observation dataset.

The analysis above shows that the electric arc furnace operates in mode A, so fault detection is performed in mode A. As shown in FIGS. 11, 12 and 13, the comparison of three figures shows that the $T^2$ statistics of the special part overrun most seriously, but the $T^2$ statistics of the common part overrun only in part of the areas, and most of the areas do not overrun. Therefore, it can determine a failure has occurred, and it concentrates in the special part.

The example above illustrates the effectiveness of the fault detector for the operating process of the electric arc furnace and the method thereof, and fault monitoring for the operating process of the electric arc furnace is realized.

What is claimed is:

1. A fault detector for operating process of an electric arc furnace, comprising:
   a host computer;
   a temperature signal acquisition equipment including an imaging device, a color sensor, two transceiver integrated circuits and a serial communication circuit, the imaging device comprises an objective lens and an eyepiece, the transceiver integrated circuit comprises a microcontroller and a RF transceiver, and one RF transceiver of the two transceiver integrated circuits works as transmitter, and the other works as an acceptor, the input terminal of the color sensor is connected to the imaging device, wherein the objective lens of the imaging device aims a measured target, a photosensitive sensor is fixed in the eyepiece at one end so that the measured target radiation light can be projected to the photosensitive parts of the color sensor by the imaging device, the color sensor is connected to the microcontroller such that when collecting the signal, the microcontroller controls the RF transmitter circuit to transmit wireless RF signals, the RF receiver circuit controls the serial communication circuit to send data to the host computer under the coordination of the microcontroller after receiving signals;
   a current signal acquisition equipment including an AC transformer and a Programmable Logic Controller (PLC), the output terminal of the AC transformer is connected to an input terminal of the PLC, and the output terminal of the PLC transformer is connected to the host computer, wherein the AC transformer is respectively connected with the three electrodes of the electric arc furnace in series, large current signals which go through the electrodes is transformed into standard signals of 0 to 5 V, and then, the standard signals are transmitted to an analog input terminal of the PLC, after analogue-to-digital conversion by the PLC, the digital signals are transmitted to the host computer through a serial port of PLC; and wherein in the first group transceiver integrated circuit, the output terminal of the color sensor is connected to the input terminal of the microcontroller, and the output terminal of the microcontroller is connected to the input terminal of the RF transmitter, the output terminal of the RF transmitter is connected to the input terminal of the RF receiver in the second group transceiver integrated circuit by a wireless network, the output terminal of the RF receiver is connected to the input terminal of the microcontroller in the second group of transceiver integrated circuit, the output terminal of the microcontroller is connected to an input terminal of the serial communication circuit, and an output terminal of the serial communication circuit is connected to the host computer and wherein two identical transceiver integrated circuits are used to transmit and receive wireless signals and to play a different role in the control of the microcontroller, a configuration software of the host computer has the function of real-time display, history enquiry, data storage and alarm processing.

2. A multimode fault monitoring and diagnosis method using the fault detector as claimed in claim 1, comprising the following steps of:

Step 1: acquiring and standardizing data, wherein M operating modes are supposed in the operating process of the electric arc furnace, three-phase current $I_A$, $I_B$ and $I_C$ in the M operating modes and temperature in the electric arc furnace are acquired when the electric arc furnace operates steadily in different modes, then, the initial dataset $\dot{X}_m = [x_{1,m}^T, x_{2,m}^T, \ldots, x_{l,m}^T \ldots, x_{N_m}^T]^T (N_m \times J)$ (m=1, 2, ..., M) is obtained, where the subscript m is the $m^{th}$ operating mode, $N_m$ is the number of the sample data in the $m^{th}$ operating mode, and J is the number of the variables which is defined as 4 in the present invention, the initial dataset is standardized by the methods of calculating the average and standard deviation, and then, the standard dataset $X_m = (N_m \times J)$ (m=1, 2, ..., M) in the normal operation state can be obtained;

Step 2: decomposing the data and establishing a preliminary monitoring model for the operating process of the electric arc furnace, wherein the M datasets are obtained in Step 1 by standardized, building the preliminary monitoring model for the operating process of the electric arc furnace, that calculate the global main factor matrix $P_g$ under the M different operating modes of the monitoring model to decompose the datasets, wherein the datasets is obtained in the M different operating modes of the electric arc furnace, then close common subsets in these M operating modes and special subsets of every operating mode are obtained; and Step 3: monitoring and diagnosing the fault of the electric arc furnace work process, wherein the preliminary monitoring model of the electric arc furnace is used to calculate the $T^2$ statistics and the SPE statistics, the score matrices $T_A^S$ and $T_B^S$ of special parts of two modes datasets and the residual error matrices $E_A^S$ and $E_B^S$ of the special parts can be obtained by combining Principal Component Analysis (PCA) algorithm, $$\begin{cases} T_A^S = X_A^S P_A^S = X_A(I - P_g P_g^T) P_A^S \\ \hat{X}_A^S = T_A^S (P_A^S)^T \\ E_A^S = X_A^S - \hat{X}_A^S \end{cases} \quad (26)$$

$$\begin{cases} T_B^S = X_B^S P_B^S = X_B(I - P_g P_g^T) P_B^S \\ \hat{X}_B^S = T_B^S (P_B^S)^T \\ E_B^S = X_B^S - \hat{X}_B^S \end{cases} \quad (27)$$

where $\hat{X}_A^S$ and $\hat{X}_B^S$ are respectively the estimated matrixes of $X_A^S$ and $X_B^S$, $P_A^S$ ($J \times R_A^S$) and $P_B^S$ ($J \times R_B^S$) are respectively the PCA loading matrixes of two special subsets, $R_A^S$ and $R_B^S$ are respectively the number of principle components for each subset, and $E_A^S$ and $E_B^S$ are respectively the residual errors of the special subsets and also the residual errors of the final model, where in the operating process of the electric arc furnace, the scores of the new observation values in the special subsets are $t_{A,new}^S = (P_A^S)^T x_{new}$ and $t_{B,new}^S = (P_B^S)^T x_{new}$, where $P_A^S$ is the loading matrix of the special subset for mode A of the electric arc furnace, $P_B^S$ is the loading matrix of the special subset for mode B of the electric arc furnace, and $X_{new}$ is the new observation data in the operating process of the electric arc furnace; the $T^2$ statistics for the special parts of mode A and mode B are calculated as follows:

$$T_{S,A}^2 = (t_{A,new}^S)^T (\Lambda_A^S)^{-1} t_{A,new}^S \quad (32)$$

$$T_{S,B}^2 = (t_{B,new}^S)^T (\Lambda_B^S)^{-1} t_{B,new}^S \quad (33)$$

and $\Lambda_A^S$ and $\Lambda_B^S$ respectively represent the diagonal matrix which consists of the eigenvalues of the special subsets, to calculate the final residual errors $e_{A,new}^S$ and $e_{B,new}^S$, $\hat{x}_{A,new}^S$ and $\hat{x}_{B,new}^S$ are supposed to be the estimated values for mode A and mode B, and then, $\hat{x}_{A,new}^S$, $\hat{x}_{B,new}^S$ and $x_{new}^S$ are submitted into equations (26) and (27) to obtain:

$$e_{A,new}^S = x_{new}^S - \hat{x}_{A,new}^S = (I - [P_g, P_A^S][P_g, P_A^S]^T) x_{new} \quad (34)$$

$$e_{B,new}^S = x_{new}^S - \hat{x}_{B,new}^S = (I - [P_g, P_B^S][P_g, P_B^S]^T) x_{new} \quad (35)$$

the SPE statistics $SPE_{A,new}^S$ and $SPE_{B,new}^S$ for mode A and mode B are obtained with the residual errors:

$$SPE_{A,new}^S = (e_{A,new}^S)^T e_{A,new}^S \quad (36)$$

$$SPE_{B,new}^S = (e_{B,new}^S)^T e_{B,new}^S \quad (37)$$

the $T^2$ statistics and the SPE statistics are used for the fault monitoring, comparing the control charts plotted respectively in mode A and mode B, the current operating mode of the electric arc furnace can be determined, and online fault detection can be performed in the corresponding operating mode, when the $T^2$ statistics and the SPE statistics of the corresponding operating mode go beyond the control limits, some fault may occur, otherwise, the whole operating process is normal.

3. The method as claimed in claim 2, wherein the preliminary monitoring model for the operating process of the electric arc furnace in Step 2 is formed by the following steps of:

1) calculating the global main factor matrix $P_g$ for the operating process of the electric arc furnace, in the operating process of the electric arc furnace, main factors for the subset of the dataset are defined as $p_m$ (m=1, 2, ..., M), where the subscript m represents the number of different operating modes; the relation between the main factor $p_m$ of the dataset for each operating mode and the dataset is:

$$p_m = \sum_{n=1}^{N_m} a_{n,m} x_{n,m} = X_m^T \alpha_m \qquad (7)$$

$\alpha_m = [a_{1,m}, a_{2,m}, \ldots, a_{n,m}]^T$ is the coefficient of the linear combination, where the letter n represents the number of rows of $\alpha_m$, $p_m$ can be represented as the linear combination of the $N_m$ vectors of $X_m$; the global main factor $p_g$ is used to describe main factors of the subset for each operating mode; the method to obtain $p_g$ is as follows:

$p_g$ is made to approximate to the subset main factor $p_{m,j}$ for each operating mode, $(p_g^T X_m^T \alpha_m)^2$ is maximized, and the maximum of the polynomial $R^2 = (p_g^T X_m^T \alpha_m)^2 + (p_g^T X_2^T \alpha_2)^2 + \ldots + (p_g^T X_M^T \alpha_m)^2$ and the inequality $$\varepsilon \leq \frac{(p_g^T X_1^T \alpha_1)^2}{(p_g^T X_2^T \alpha_2)^2} = \frac{(p_g^T X_2^T \alpha_2)^2}{(p_g^T X_3^T \alpha_3)^2} \leq \frac{1}{\varepsilon}$$

are calculated, where $\epsilon$ is a constraint parameter and satisfies the condition of $0.8 \leq \epsilon < 1$; to make $p_g$ approximate to $p_{m,j}$, solve the following equation:

$$\max R^2 = \max\left(\sum_{m=1}^M (p_g^T X_m^T \alpha_m)^2\right) \qquad (8)$$

satisfy constraints at the same time as follows:

$$\text{s.t.} \begin{cases} \varepsilon(p_g^T X_{m-1}^T \alpha_{m-1})^2 - (p_g^T X_m^T \alpha_m)^2 \leq 0 \\ \varepsilon(p_g^T X_m^T \alpha_m)^2 - (p_g^T X_{m-1}^T \alpha_{m-1})^2 \leq 0 \\ p_g^T p_g = 1 \\ \alpha_m^T \alpha_m = 1 \end{cases} \qquad (9)$$

mode A and mode B respectively represent the operating modes of the electric arc furnace generated by the voltage A and voltage B, M is 2; an objective function is defined, and the maximum of the objective function is calculated as follows:

$$F(p_g, \alpha, \lambda) = (p_g^T X_A^T \alpha_A)^2 + (p_g^T X_B^T \alpha_B)^2 - \qquad (10)$$
$$\lambda_g(p_g^T p_g - 1) - \lambda_A(\alpha_A^T \alpha_A - 1) - \lambda_B(\alpha_B^T \alpha_B - 1) -$$
$$\lambda_1\left(\varepsilon(p_g^T X_A^T \alpha_A)^2 - (p_g^T X_B^T \alpha_B)^2\right) - \lambda_2\left(\varepsilon(p_g^T X_B^T \alpha_B)^2 - (p_g^T X_A^T \alpha_A)^2\right)$$

where: $\lambda_g, \lambda_A, \lambda_B, \lambda_1$ and $\lambda_2$ are constants; $p_g$, $\alpha_A$ and $\alpha_B$ in above equation are solved by a partial derivative to obtain the following equations respectively:

$$(1-\lambda_1\varepsilon+\lambda_2)X_A^T X_A p_g + (1-\lambda_2\varepsilon+\lambda_1)X_B^T X_B p_g = \lambda_g p_g \qquad (11)$$

$$\alpha_A = \sqrt{\frac{(1-\lambda_1\varepsilon+\lambda_2)}{\lambda_A}} X_A p_g = \sqrt{\frac{1}{p_g^T(X_A^T X_A)p_g}} X_A p_g \qquad (12)$$

$$\alpha_B = \sqrt{\frac{(1-\lambda_2\varepsilon+\lambda_1)}{\lambda_B}} X_B p_g = \sqrt{\frac{1}{p_g^T(X_B^T X_B)p_g}} X_B p_g \qquad (13)$$

$\lambda_A$ and $\lambda_B$ can be calculated from equations (11), (12) and (13):

$$\lambda_A = (1-\lambda_1\varepsilon+\lambda_2)p_g^T(X_A^T X_A)p_g \qquad (14)$$

$$\lambda_B = (1-\lambda_2\varepsilon+\lambda_1)p_g^T(X_B^T X_B)p_g \qquad (15)$$

based on the inequality $$\varepsilon \leq \frac{(p_g^T X_1^T \alpha_1)^2}{(p_g^T X_2^T \alpha_2)^2} = \frac{(p_g^T X_2^T \alpha_2)^2}{(p_g^T X_3^T \alpha_3)^2} \leq \frac{1}{\varepsilon},$$

$p_g$ should satisfy the following equations:

$$\begin{cases} \lambda_1\left(\varepsilon(p_g^T X_A^T \alpha_A)^2 - (p_g^T X_B^T \alpha_B)^2\right) = 0, & (16) \\ \lambda_2\left(\varepsilon(p_g^T X_B^T \alpha_B)^2 - (p_g^T X_A^T \alpha_A)^2\right) = 0, & (17) \\ \lambda_1, \lambda_2 \geq 0. \end{cases}$$

the results of equations (12) and (3) are submitted into equations (16) and (17) to obtain the result as follows:

$$\begin{cases} \lambda_1(\varepsilon p_g^T(X_A^T X_A)p_g - p_g^T(X_B^T X_B)p_g) = 0, & (18) \\ \lambda_2(\varepsilon p_g^T(X_B^T X_B)p_g - p_g^T(X_A^T X_A)p_g) = 0, & (19) \\ \lambda_1, \lambda_2 \geq 0. \end{cases}$$

in above equation, in order to calculate $p_g$, the values of $\lambda_1$ and $\lambda_2$ are analyzed as follows:

(1) if $\lambda_1 \neq 0$ and $\lambda_2 \neq 0$, the equations (18) and (19) are contradictory; therefore, the equation has no solution in this case;

(2) if $\lambda_1 = 0$ and $\lambda_2 = 0$, the equations (18) and (19) are constantly equal to 0, equations (18) and (19) lose constraints; and equation (11) can be rewritten as follows:

$$X_A^T X_A p_g + X_B^T X_B p_g = \lambda_g p_g \qquad (20)$$

from equation (20), calculating $p_g$ changes to calculating the eigenvector of $(X_A^T X_A + X_B^T X_B)$, and using the calculation method can obtain the maximum of polynomial $(p_g^T X_A^T \alpha_A)^2 + (p_g^T X_B^T \alpha_B)^2$, however, equations (18) and (19) lose constraints, so $p_g$ may not approximate to the main factor of the subset for both mode A and mode B; therefore, the solution $p_g$ cannot meet requirements, (3) if $\lambda_1 = 0$ and $\lambda_2 \neq 0$, equations (18) and (19) are calculated to obtain:

$$\varepsilon p_g^T(X_B^T X_B)p_g - p_g^T(X_A^T X_A)p_g = 0 \qquad (21)$$

where the parameter $\epsilon$ should meet the condition of $0.8 \leq \epsilon < 1$; the equation (21) has only one unknown vector $p_g$; equation (21) which has only one unknown vector $p_g$ is calculated to obtain the solution as $p_g$, which is defined as $p_{g1}$, (4) If $\lambda_1 \neq 0$ and $\lambda_2 = 0$, the same method is used, and the following equation is obtained:

$$\varepsilon p_g^T(X_A^T X_A)p_g - p_g^T(X_B^T X_B)p_g = 0 \qquad (22)$$

the analysis method similar to the method in step (3) is used to obtain the solution of another $p_g$ which is defined as $p_{g2}$, $p_{g1}$ and $p_{g2}$ can be the solutions of $p_g$ which meet the conditions; $p_{g1}$ and $p_{g2}$ are combined together to constitute a matrix $P_g=[p_{g1}, p_{g2}]$ of the R row, where the sum of the rows of $p_{g1}$ and $p_{g2}$ is R; then, the global main factor matrix $P_g(J\times R)$ for the operating process of the electric arc furnace is obtained as the solution which meets the assuming conditions; and 2) decomposing the datasets for the two operating modes of the electric arc furnace, the global main factor matrix $P_g(J\times R)$ for the operating process of the electric arc furnace is obtained by the modeling above; the column vectors of $P_g$ should meet the linear conditions $p_g=X_A^T\alpha_1$ and $p_g=X_B^T\alpha_2$, where $\alpha_1$ and $\alpha_2$ are the linear combination coefficients, $p_g^T p_g=1$, $\alpha_1^T\alpha_1=1$, and $\alpha_2^T\alpha_2=1$; then, the equations above can be translated into $\alpha_1=X_A p_g$ and $\alpha_2=X_B p_g$; R linear combination coefficients $\alpha_1$ and $\alpha_2$ are made respectively to constitute the score matrices $T_A^C$ and $T_B^C$ of the two special subsets, and the following equation can be obtained:

$$T_A^C = X_A P_g, T_B^C = X_B P_g \tag{23}$$

by the following calculation, the dataset $X_A$ for mode A of the electric arc furnace can be decomposed into the common dataset $X_A^C$ containing common information and the special dataset $X_A^S$, $$\begin{cases} X_A = X_A^C + X_A^S \\ X_A^C = T_A^C P_g^T = X_A P_g P_g^T \\ X_A^S = X_A - X_A^C = X_A^T(I - P_g P_g^T) \end{cases} \tag{24}$$

the dataset $X_B$ for mode B of the electric arc furnace can be decomposed into the common dataset $X_B^C$ and special dataset $X_B^S$ in the same method, $$\begin{cases} X_B = X_B^C + X_B^S \\ X_B^C = T_B^C P_g^T = X_B P_g P_g^T \\ X_B^S = X_B - X_B^C = X_B^T(I - P_g P_g^T) \end{cases} \tag{25}$$

after the decomposition above is completed, the preliminary monitoring model for the operating process of the electric arc furnace is established.

4. The method as claimed in claim 2, wherein calculating the Hotelling $T^2$ statistics and the SPE statistics are as follows:

by the following calculation, the dataset $X_A$ for mode A of the electric arc furnace can be decomposed into the common dataset $X_A^C$ containing common information and the special dataset $X_A^S$, $$\begin{cases} X_A = X_A^C + X_A^S \\ X_A^C = T_A^C P_g^T = X_A P_g P_g^T \\ X_A^S = X_A - X_A^C = X_A^T(I - P_g P_g^T) \end{cases} \tag{24}$$

The dataset $X_B$ for mode B of the electric arc furnace can be decomposed into the common dataset $X_B^C$ and the special dataset $X_B^S$, $$\begin{cases} X_B = X_B^C + X_B^S \\ X_B^C = T_B^C P_g^T = X_B P_g P_g^T \\ X_B^S = X_B - X_B^C = X_B^T(I - P_g P_g^T) \end{cases} \tag{25}$$

the score matrices $T_A^S$ and $T_B^S$ for special parts of the two-mode datasets and the residual error matrices $E_A^S$ and $E_B^S$ for the special parts can be obtained by combining with the Principal Component Analysis (PCA) algorithm, $$\begin{cases} T_A^S = X_A^S P_A^S = X_A(I - P_g P_g^T)P_A^S \\ \hat{X}_A^S = T_A^S (P_A^S)^T \\ E_A^S = X_A^S - \hat{X}_A^S \end{cases} \tag{26}$$

$$\begin{cases} T_B^S = X_B^S P_B^S = X_B(I - P_g P_g^T)P_B^S \\ \hat{X}_B^S = T_B^S (P_B^S)^T \\ E_B^S = X_B^S - \hat{X}_B^S \end{cases} \tag{27}$$

where: $\hat{X}_A^S$ and $\hat{X}_B^S$ are respectively the estimated matrixes of $X_A^S$ and $X_B^S$, $P_A^S(J\times R_A^S)$ and $P_B^S(J\times R_B^S)$ are respectively the loading matrixes of two special subsets by the PCA algorithm, $R_A^S$ and $R_B^S$ are respectively the number of principle components for each subset, and $E_A^S$ and $E_B^S$ are respectively the residual errors of the special subsets as well as the final model, the datasets for mode A and mode B are decomposed into common datasets and special datasets, $X_A^C$ and $X_A^S$ are obtained from equation (24), and $X_B^C$ and $X_B^S$ are obtained from equation (25); and then, the diagonal matrix which consists of eigenvalues of the four matrix, the eigenvalue of $X_A^C$ is supposed to be $\phi$, so the characteristic polynomial of $X_A^C$ is $|\phi\cdot E - X_A^C|$, where E is the unit matrix; the characteristic polynomial is made to be equal to zero, $|\phi\cdot E - X_A^C|=0$, so the characteristic equation $G(\phi)=0$ whose variable $\phi$ is obtained after being sorted; the eigenvalues of $X_A^C$ can be obtained after solving the characteristic equation; the eigenvalues of $X_A^C$ are used as diagonal elements to obtain the diagonal matrix $\Lambda_A^C$, diagonal matrixes $\Lambda_A^C$, $\Lambda_B^C$, and $\Lambda_B^S$ which consist of the eigenvalues of another three matrixes $X_A^S$, $X_B^C$ and $X_B^S$ can be obtained in the same method, fault detection analysis in the common datasets and the special datasets for mode A and mode B are performed respectively, the Hotelling $T^2$ statistics and the SPE statistics are used for fault detection, and faults can be detected by plotting the control chart; $x_{new}(J\times 1)$ is the new observation data of the electric arc furnace operating process, by projecting $x_{new}$ to the global main factor $P_g$, the common datasets score vector of the new sample data for two modes $t_{new}^C = P_g^T x_{new}$ can be obtained, At the same time, the $T^2$ statistics $T_{C,A}^2$ and $T_{C,B}^2$ of common parts of mode A and mode B can be obtained by the following equations (30) and (31), the $T^2$ statistics of the common parts of the two modes are calculated as follows:

$$T_{C,A}^2 = (t_{new}^C)^T (\Lambda_A^C)^{-1} t_{new}^C \tag{30}$$

$$T_{C,B}^2 = (t_{new}^C)^T (\Lambda_B^C)^{-1} t_{new}^C \tag{31}$$

the scores of the special subsets of the electric arc furnace operating process, $t_{A,new}^S = (P_A^S)^T x_{new}$ and $t_{B,new}^S = (P_B^S)$ $^T x_{new}$, are calculated in the similar method, meanwhile equations (32) and (33) below are used to calculate the $T^2$ statistics of the special subsets of mode A and mode B $$T_{S,A}^2 = (t_{A,new}^S)^T (\Lambda_A^S)^{-1} t_{A,new}^S \tag{32}$$

$$T_{S,B}^2 = (t_{B,new}^S)^T (\Lambda_B^S)^{-1} t_{B,new}^S \tag{33}$$

$\Lambda_A^S$ and $\Lambda_B^S$ respectively represent the diagonal matrixes which consist of the eigenvalues of the special subsets, calculating the final residual errors $e_{A,new}^S$ and $e_{B,new}^S$, $\hat{x}_{A,new}^S$ and $\hat{x}_{B,new}^S$ are supposed to be the estimated values of $x_{new}^S$ in mode A and mode B, and $\hat{x}_{A,new}^S$, $\hat{x}_{B,new}^S$ and $x_{new}^S$ are submitted into equations (26) and (27) to obtain following equations:

$$e_{A,new}^S = x_{new}^S - \hat{x}_{A,new}^S = (I - [P_g, P_A^S][P_g, P_A^S]^T) x_{new} \tag{34}$$

$$e_{B,new}^S = x_{new}^S - \hat{x}_{B,new}^S = (I - [P_g, P_B^S][P_g, P_B^S]^T) x_{new} \tag{35},$$

the SPE statistics $SPE_{A,new}^S$ and $SPE_{B,new}^S$ for mode A and mode B are calculated by the residual errors:

$$SPE_{A,new}^S = (e_{A,new}^S)^T e_{A,new}^S \tag{36}$$

$$SPE_{B,new}^S = (e_{B,new}^S)^T e_{B,new}^S \tag{37}.$$

\* \* \* \* \*